United States Patent [19]

Pendse

[11] Patent Number: 5,764,486
[45] Date of Patent: Jun. 9, 1998

[54] COST EFFECTIVE STRUCTURE AND METHOD FOR INTERCONNECTING A FLIP CHIP WITH A SUBSTRATE

[75] Inventor: Rajendra D. Pendse, Fremont, Calif.

[73] Assignee: Hewlett Packard Company, Palo Alto, Calif.

[21] Appl. No.: 728,876

[22] Filed: Oct. 10, 1996

[51] Int. Cl.$^6$ ............................................. H01R 9/09
[52] U.S. Cl. .................... 361/774; 29/850; 228/179.1; 361/760; 361/772; 361/773; 361/776
[58] Field of Search .......................... 29/837, 838, 845, 29/850, 854, 857, 863; 174/260, 267; 228/179.1, 180.21, 180.5; 257/690, 692, 697, 723, 724, 773, 780, 784; 361/760, 772, 773, 774, 776, 777, 779, 783; 438/117; 439/66, 482, 68, 70, 72, 69; 324/755, 756, 757, 761, 765, 538, 158.1

[56] References Cited

U.S. PATENT DOCUMENTS

| | | |
|---|---|---|
| 4,975,079 | 12/1990 | Beaman et al. ................ 324/765 |
| 5,056,216 | 10/1991 | Madou et al. ................ 228/180.21 |
| 5,349,495 | 9/1994 | Visel et al. ................ 361/760 |
| 5,561,594 | 10/1996 | Wakefield ................ 361/773 |

*Primary Examiner*—Donald Sparks
*Attorney, Agent, or Firm*—Brian R. Short

[57] ABSTRACT

An electrical interconnection between a flip chip and a substrate. The interconnection includes a substrate having conductive pads to which wire bumps are attached. Each wire bump includes an elastically deformable stub section attached to the ball section, and a pointed tip. The pointed tip pierces a soft conductive layer located on a conductive pads of a flip chip. The elastic deformation of the stub section provides for consistent electrical connections between the flip chip and the substrate when the flip chip and the substrate are non-planar. An adhesive is located between the flip chip and the substrate and encompasses the wire bumps.

7 Claims, 2 Drawing Sheets

5,764,486

1

COST EFFECTIVE STRUCTURE AND METHOD FOR INTERCONNECTING A FLIP CHIP WITH A SUBSTRATE

FIELD OF INVENTION

This invention relates generally to interconnecting an integrated circuit to a substrate. In particular, it relates to a cost effective structure for interconnecting a flip chip integrated circuit to a substrate.

BACKGROUND

Various methods for electrically connecting bare die integrated circuits to printed circuit substrates to form multi-chip modules are well known in the art. Among all the types of multi-chip modules, the technique of flip chip with solder bumps has been developed the most. A flip chip is an unpackaged integrated circuit chip in which solder bumps have been formed on the bonding pads. The solder bumps are approximately hemispherically shaped solidified solder attached to the bonding pads and are typically of a tin-lead composition. The unpackaged chip does not have a plastic shell or metallic leads common to most integrated circuit packages.

The active side of the flip chip contains the active devices and bonding pads and has a passivation layer that protects the chip's active components from environmental contaminants. The solder bumps of the flip chip are positioned in registering contact with the substrate circuit conductive contact areas. Electrical and mechanical attachment between the solder bumps and the conductive contact areas of the substrate circuit is provided by heating the solder bumps until the solder reflows.

Flip chip technology is a well established and proven technology. However, flip chip technology suffers from some very important limitations. The formation of the solder bumps on a flip chip wafer requires several processing steps. Other packaging technologies like wire bonding do not require these processing steps. Therefore, packaging a wafer with solder bumps can be more expensive than other packaging technologies.

Typically, a large number of flip chips are fabricated on a single wafer. Most silicon wafers will only yield a small number of useable flip chips. Furthermore, many silicon flip chips have a large number of bonding pads. Fabrication of the wafer requires solder bumps to be formed on all of the bonding pads associated with all of the flip chips on the wafer. As the yield of useable flip chips on the wafer decreases, the cost of forming solder bumps per flip chip increases. As the number of bonding pads per flip chip increases, the cost of forming solder bumps per flip chip increases. As a result, the incremental cost of forming solder bumps per flip chip can be substantial.

Another obstacle to the proliferation of solder bump technology into industry is the complexity of the technology. Furthermore, a large amount of the technology that has been developed is proprietary.

It is desirable to have a structure for electrically connecting an area array flip chip package to a substrate which does not require extra wafer processing steps. Furthermore, it is desirable that the structure be inexpensive and easily implemented with existing integrated circuit packaging technologies.

SUMMARY OF THE INVENTION

The present invention provides a cost effective structure for interconnecting a flip chip with a substrate. This structure

2 allows the interconnection to be made without requiring the fabrication process of the flip chip to include the extra processing steps needed to form solder bumps on the flip chip.

A first embodiment of this invention includes a flip-chip interconnection structure. The structure includes an integrated circuit having a plurality of first conductive pads. Each conductive pad is covered with a layer of soft conductive material. This embodiment further includes a substrate having a plurality of second conductive pads. This embodiment also includes a plurality of conductive wire bumps. Each wire bump includes a ball portion mechanically and electrically attached to a second conductive pad, an elastically deformable stub portion having a first end attached to the ball portion, and a pointed tip region formed on a second end of the stub portion. The pointed tip pierces the layer of soft conductive material on a first conductive pad providing electrical contact between the wire bump and the first conductive pad.

A second embodiment of the invention is similar to the first embodiment and further includes an adhesive located between the integrated circuit and the substrate. The adhesive encompasses the wire bumps and provides a compressive force between the integrated circuit and the substrate. Furthermore, the adhesive helps maintain the placement between the substrate and the integrated circuit.

Other aspects and advantages of the present invention will become apparent from the following detailed description, taken in conjunction with the accompanying drawings, illustrating by way of example the principles of the invention.

DETAILED DESCRIPTION

Figure 1:
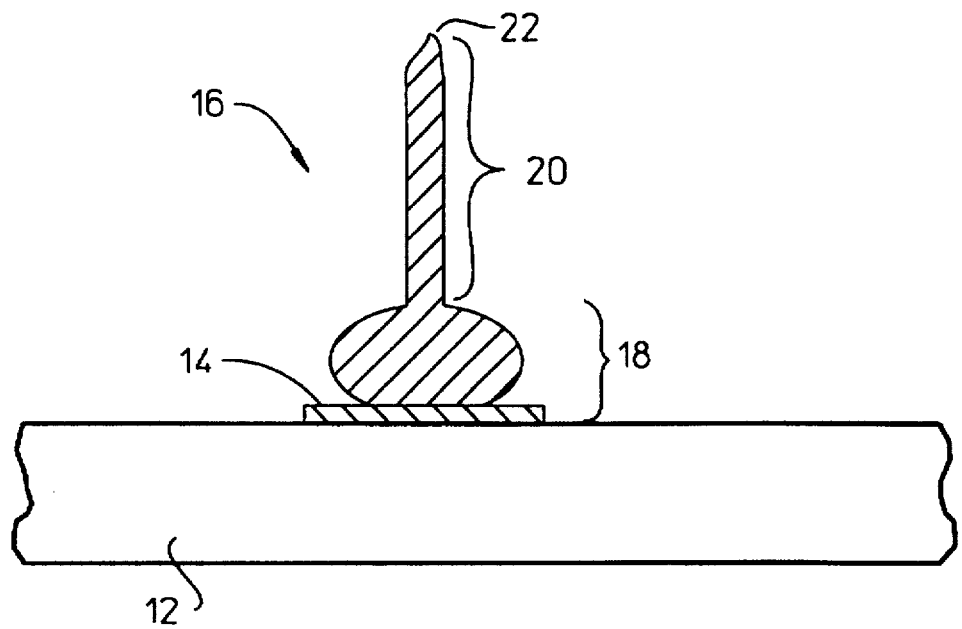
FIG. 1 shows a conductive wire bump of the invention attached to a substrate.

As shown in the drawings for purposes of illustration, the invention is embodied in an apparatus and method for interconnecting a flip chip to a substrate. This invention is based on presently existing integrated circuit packaging technology. The interconnections of the flip chip with the substrate are made with a plurality of wire bumps. Each wire bump includes a pointed tip, a stub portion and a ball portion. The stub portions elastically deform to provide an electrical connection between the flip chip and the substrate when the flip chip and the substrate are non-planar.

FIG. 1 shows the structure of a wire bump 16 of this invention before the wire bump is used to interconnect a flip chip to a substrate. The wire bump 16 is generally made of gold but may consist of any conductive material. The wire bump 16 is formed on a conductive pad 14 of a substrate 12 using a modified wire bonder. The wire bump 16 consists of a ball portion 18 at one end, a pointed tip 22 at another end, and a stub portion 20 interconnecting the two ends of the wire bump 16.

Figure 2:
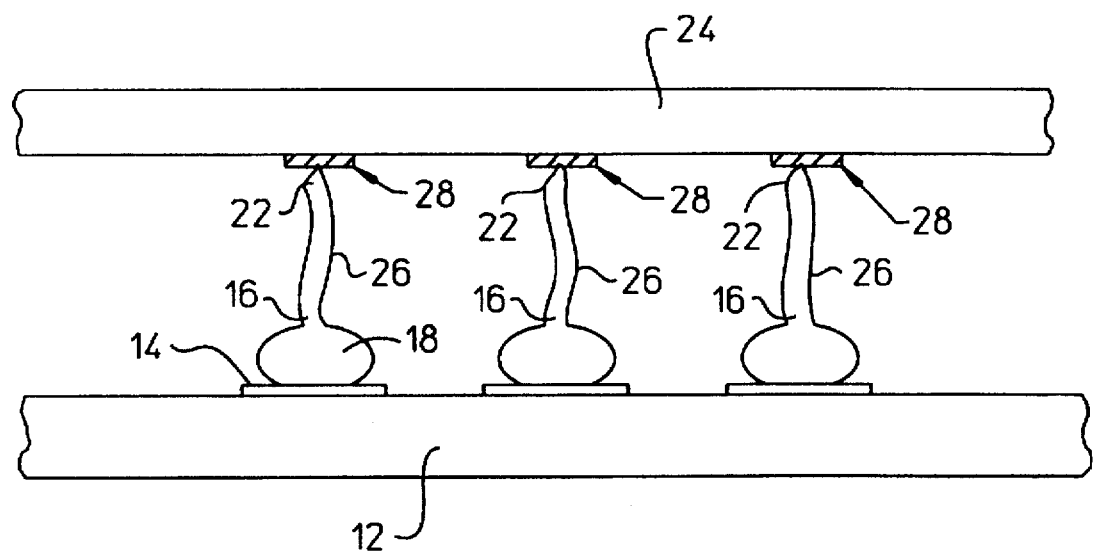
FIG. 2 shows a plurality of conductive wire bumps connecting a substrate to a flip chip in which stub portions of the wire bump connections are elastically deformed.

FIG. 2 shows the structure of several wire bumps 16 interconnecting a substrate 12 to a flip chip 24. The interconnecting wire bumps 16 include elastically deformed stub portions 26. The elastically deformable stub portions 26 are deformed by pressing the substrate 12 towards the flip chip 24. The electrical interconnections between the substrate 12 and the flip chip 24 are made as the pointed tips 22 of the wire bumps pierce soft conductive layers 28 formed on bonding pads of the flip chip 24. The elastic deformation of the stub portion 26 of the wire bumps 16 provides consistency in the electrical interconnections when the surfaces of the flip chip 24 and the substrate 12 are not parallel.

Figure 3:
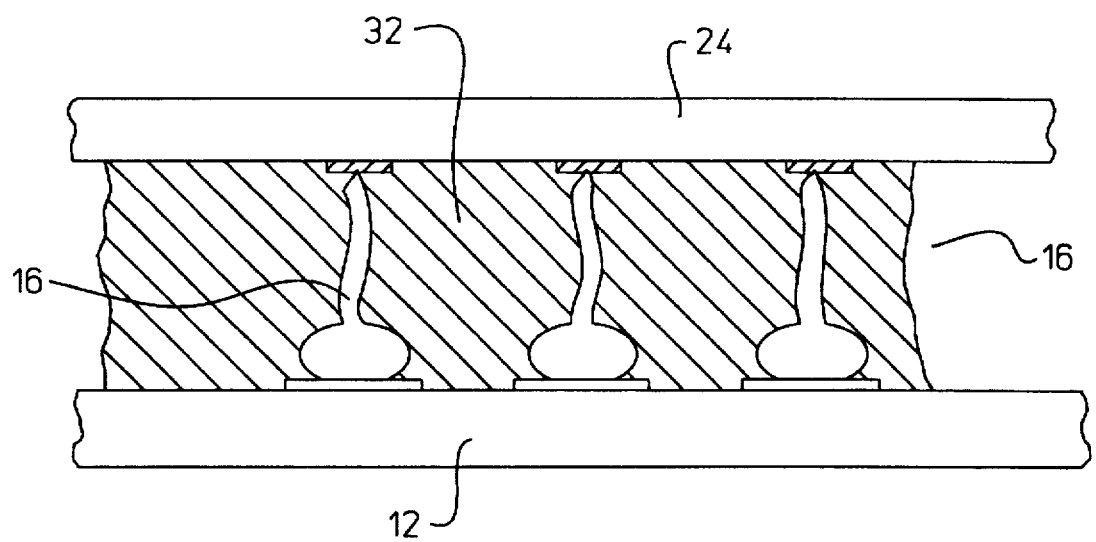
FIG. 3 shows the configuration of FIG. 2 further including an adhesive between the substrate and the flip chip.

An adhesive material 32 is shown in FIG. 3. The adhesive material 32 is located between the flip chip 24 and the substrate 12 and encompasses the wire bonds 16. Preferably, the adhesive 32 is ultra violet (UV) curable rather than heat curable. A UV curable adhesive is easier to cure once the flip chip 24 is electrically interconnected to the substrate 12.

An embodiment of this invention may be fabricated by bonding wires to conductive pads on a substrate. Wire bumps are formed by pulling each of the bonded wires after the bond has been formed so that each wire breaks due to tension on the wire. A pointed tip is formed on the broken end of each wire. The pointed tips have a cone structure. The substrate is then covered with an adhesive so that entire length of the wire bumps is immersed in the adhesive. A flip chip having conductive pads aligned with the wire bumps is pressed towards the wire bumps so that the pointed tips of the wire bumps make contact with the soft conductive layer formed on the conductive pads of the flip chip. If the tips of the wire bonds are covered with adhesive, the adhesive is displaced to allow the tips of the wire bonds to extend beyond the adhesive and make electrical contact with the conductive pads of the flip chip. Finally, the adhesive is cured to solidify the placement of the wire bumps relative to the flip chip and the substrate.

Ohmic contact is formed between the pointed tips of the wire bumps and the conductive pads of the flips chip. The ohmic contact is made as a result of the combination of the deformation of the stub sections and the pointed nature of the tips. The deformation of the stub sections provide an upward force of the pointed sections against the conductive pads. The deformation also accommodates for deviations of the planarity between the flip chip and the substrate. The pointed tips pierce the soft conductive layers located on the conductive pads. The combination of the deformation and the pointed tips provide a scrubbing interaction between the pointed ends of the wire bumps and the soft conductive layer on the conductive pads of the flip chip.

This invention can include an assembly system which provides additional scrubbing action that enhances the electrical contact between the pointed tips and the conductive pads of the flip chip. The additional scrubbing can be provided by either delivering a force to the system like a wafer prober, or a reciprocating motion may be provided between the flip chip and the substrate.

The height of a wire bump 26 is generally about three times the diameter of the stub portion 26. The diameter of the stub portion 26 is typically about 30 microns. Because of the high aspect ratio and the pointed nature of the tips 22, a minimal force of 0.5 to 1gm forcing the flip chip 24 towards the substrate 12 is required to establish good ohmic contact between the pointed tips 22 and the conductive pads 28 of the flip chip 24.

The ball portions 18 are formed by wire bonding conductive wires onto the conductive pads 14 of the substrate 12. A standard wire bonder may be used as long as the strain rate of the wire can be controlled.

The pointed tip 22 of a wire bump 16 is formed by pulling a bonding wire until the bonding wire breaks due to ductile failure. The geometrical shape of the tip 22 is controlled by several factors. These factors include the metallic properties of the wire, the microstructure of the wire and the strain rate at which the wire is pulled.

The metallic properties of the wire which influence the shape of the tip of the wire bump are the percentage of elongation and the ultimate tensile strength (UTS). The percentage of elongation is a property of the wire which refers to the percentage that the wire elongates with respect to the total length of the wire before the wire breaks. To form the desired tip geometry of this invention, the percentage of elongation for gold wire should be about three to four percent. The ultimate tensile strength should be about thirty five to fifty kilograms per square millimeter.

The microstructure of the wire influences what is termed the heat affected zone of the wire. A ball is formed on the end of the wire by rapidly heating the end of the wire. The heat affected zone is the region of the wire which is affected by the heat. The time in which the end of the wire is heated is commonly called the spark time. The length of the spark time and the microstructure of the wire determine the heat affected zone of the wire. When the wire is pulled on to form the point tip, the wire fractures outside of the heat affected zone. Therefore, the heat affected zone of the wire determines the length of the wire bond and affects the shape of the point at the end of the wire bond.

The strain rate of the wire is the most critical factor in determining the geometry of the pointed end of the wire bond. The strain rate defines how fast the wire is pulled after the wire has been bonded to a conductive pad of the substrate. If the wire is pulled too slowly, the wire will break as a ductile fracture. A ductile fracture results in a soft, long pointed tip. If the wire is pulled too quickly, the wire will break as a brittle fracture. A brittle fracture will results in a hard, flat tip. The desired tip is both hard and pointed. For a gold wire having a percentage elongation of three to four percent, the desired strain rate is approximately 0.5 per second. This strain rate yields a pointed tip in which the tip height is approximately equal to the diameter of the stub portion.

As was previously mentioned, the length of the stub portion is primarily determined by the microstructure of the wire and the spark time. A feature of the stub portion of the wire bonds is that the stub portion deforms when a force is applied between the flip chip and the substrate. The deformation of the stub sections provides uniformity between the interconnections when the flip chip and the substrate are non-planar.

In an alternative embodiment of this invention, the wire bumps are formed on the flip chip rather than on the substrate. This approach, however, has some limitations. The process for forming wire bumps is thermosonic in nature and cannot be performed on active silicon circuitry. Therefore, this embodiment limits the wire bonds to be formed at the perimeter of the flip chip outside the region where the active silicon circuitry is located. However, this embodiment still offers a cost effective alternative to many conventional solder bumping applications such as Direct Chip Attachment (DCA). DCA requires a solder bump arrangement in which the bumps are located on the perimeter due to routing limitations of printed circuit boards.

In another embodiment of this invention, the structure does not include an adhesive material between the flip chip and the substrate. However, the functionality of the adhesive is provided by some other means. One of the functions of the adhesive is to provide a compressive force between the flip chip and the substrate during the formation of the interconnections. The required compressive force can be provided by a spring system. An advantage of a spring system is that the flip chip can be removed at a later time for testing.

Although specific embodiments of the invention have been described and illustrated, the invention is not to be limited to the specific forms or arrangements of parts so described and illustrated. The invention is limited only by the claims.

What is claimed is:

1. A flip-chip interconnection structure comprising:

an integrated circuit having a first conductive pad, the first conductive pad comprising a soft conductive material layer;

a substrate having a second conductive pad;

a conductive wire bump comprising;
   a first extremity mechanically and electrically attached to the second conductive pad;
   an elastically deformable stub portion; and
   a second extremity defining a pointed tip, the pointed tip piercing the soft conductive material of the first conductive pad thereby providing electrical contact between the wire bump and the first conductive pad; and means for providing compressive pressure between the substrate and the integrated circuit.

2. The flip-chip interconnection structure as recited in claim 1, further comprising a plurality of conductive wire bumps electrically connecting a plurality of first conductive pads on the integrated circuit to a plurality of second conductive pads on the substrate.

3. The flip-chip interconnection structure as recited in claim 1, wherein the means for providing compressive pressure comprises an adhesive located between the integrated circuit and the substrate and enclosing the wire bumps.

4. The flip-chip interconnection structure as recited in claim 1, wherein the wire bump is formed from gold.

5. A flip-chip interconnection structure comprising:

an integrated circuit having a first conductive pad;

a substrate having a second conductive pad, the second conductive pad comprising a soft conductive material layer;

a conductive wire bump comprising;
   a first extremity mechanically and electrically attached to the second conductive pad;
   an elastically deformable stub portion; and
   a second extremity defining a pointed tip, the pointed tip piercing the soft conductive material of the second conductive pad thereby providing electrical contact between the wire bump and the first conductive pad; and means for providing compressive pressure between the substrate and the integrated circuit.

6. A method of interconnecting a flip chip with a substrate, the method comprising the steps of:

(a) bonding a wire to a first conductive pad of the substrate;

(b) pulling the wire so that the wire fractures forming a stub region and a pointed tip;

(c) depositing an adhesive on the substrate so that the adhesive covers the stub region;

(d) placing the flip chip over the substrate so that a second conductive pad of the flip chip makes contact with the pointed tip;

(e) forcing the flip chip towards the substrate so that the pointed tip pierces a conductive layer located on the second conductive pad of the flip chip; and (f) curing the adhesive.

7. The method of interconnecting a flip chip with a substrate as recited in claim 6, wherein step (e) further comprises the step of inducing a scrubbing action between the pointed tip and the conductive layer of the second conductive pad of the flip chip.

* * * * *